(12) United States Patent
Schultz et al.

(10) Patent No.: US 12,564,040 B2
(45) Date of Patent: Feb. 24, 2026

(54) POWER VIA WITH REDUCED RESISTANCE

(71) Applicants: Advanced Micro Devices, Inc., Santa Clara, CA (US); ATI Technologies ULC, Markham (CA)

(72) Inventors: Richard T. Schultz, Fort Collins, CO (US); Omid Rowhani, Markham (CA)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 712 days.

(21) Appl. No.: 17/937,313

(22) Filed: Sep. 30, 2022

(65) Prior Publication Data

US 2024/0113022 A1     Apr. 4, 2024

(51) Int. Cl.
| | |
|---|---|
| *H01L 23/528* | (2006.01) |
| *H01L 21/768* | (2006.01) |
| *H01L 23/535* | (2006.01) |
| *H10D 84/90* | (2025.01) |

(52) U.S. Cl.
CPC .... *H01L 23/5286* (2013.01); *H01L 21/76898* (2013.01); *H01L 23/535* (2013.01); *H10D 84/907* (2025.01); *H10D 84/987* (2025.01)

(58) Field of Classification Search
CPC ........... H01L 23/5286; H01L 21/76898; H01L 23/535; H01L 23/481; H10D 84/907; H10D 84/987; H10D 84/981; H10D 89/10
See application file for complete search history.

(56) References Cited

U.S. PATENT DOCUMENTS

| | | | |
|---|---|---|---|
| 2021/0082815 A1* | 3/2021 | Doornbos ........... | H01L 23/5286 |
| 2022/0084561 A1* | 3/2022 | Chen ........................ | G11C 8/08 |

* cited by examiner

*Primary Examiner* — Patricia D Valenzuela
(74) *Attorney, Agent, or Firm* — Kowert, Hood, Munyon, Rankin & Goetzel, PC; Rory D. Rankin

(57) ABSTRACT

An apparatus and method for efficiently routing power signals across a semiconductor die. In various implementations, an integrated circuit includes, at a first node that receives a power supply reference, a first micro through silicon via (TSV) that traverses through a silicon substrate layer to a backside metal layer. The integrated circuit includes, at a second node that receives the power supply reference, a second micro TSV that physically contacts at least one source region. The integrated circuit includes a first power rail that connects the first micro TSV to the second micro TSV. This power rail replaces contacts between the micro TSVs and a second power rail such as the frontside metal zero (M0) layer. Each of the first power rail, the second power rail, and the backside metal layer provides power connection redundancy that increases charge sharing, improves wafer yield, and reduces voltage droop.

20 Claims, 5 Drawing Sheets

Standard Cell Layout
100
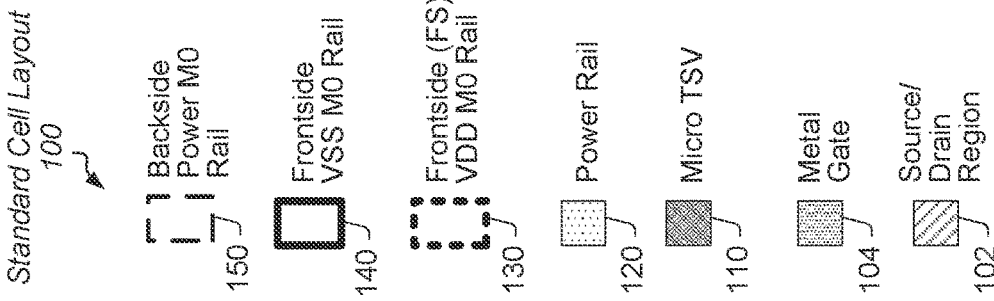
Backside
Power M0
Rail
150
Frontside
VSS M0 Rail
140
Frontside (FS)
VDD M0 Rail
130
Power Rail
120
Micro TSV
110
Metal
Gate
104
Source/
Drain
Region
102
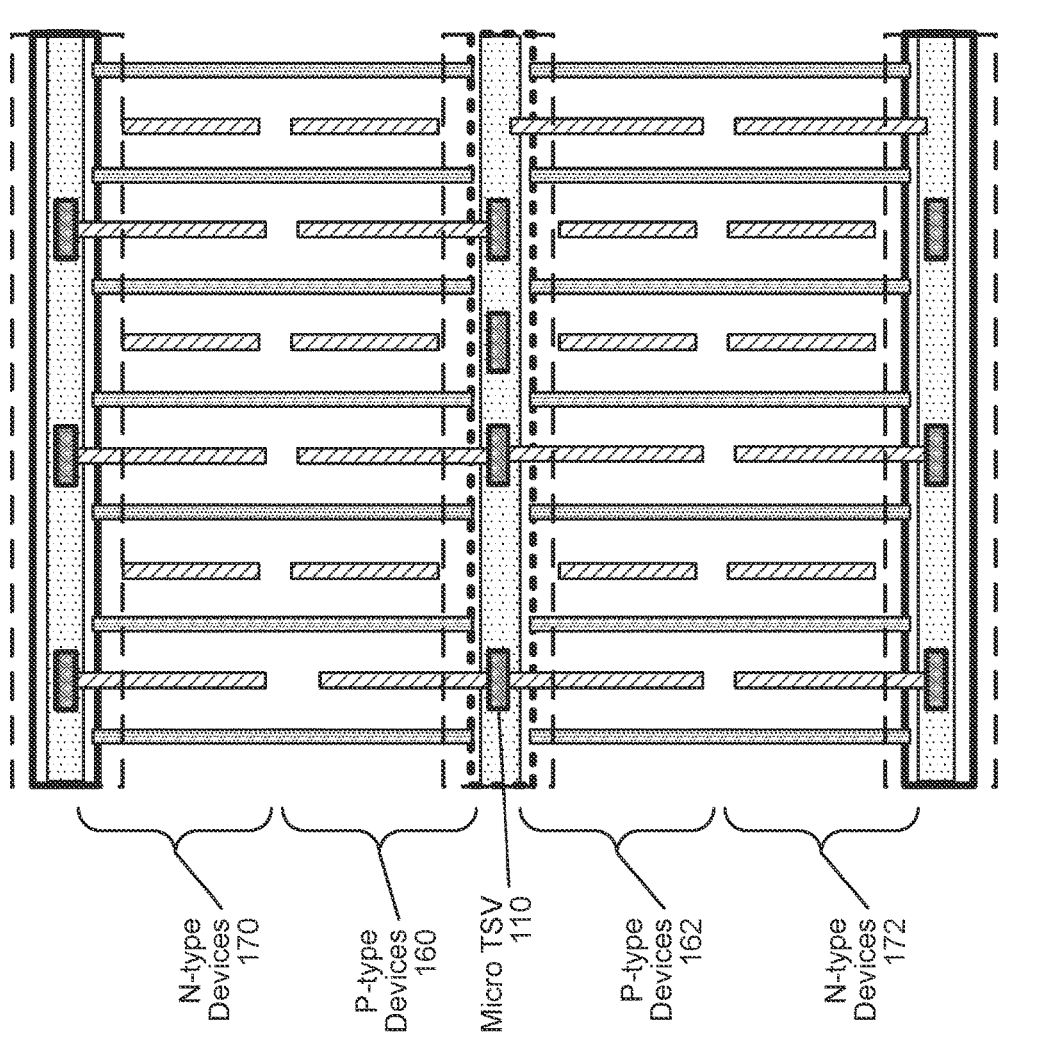
N-type
Devices
170
P-type
Devices
160
Micro TSV
110
P-type
Devices
162
N-type
Devices
172
FIG. 1

*Power Connections*
*200*

Backside
Power M0
Rail
150

Frontside (FS)
VDD M0 Rail
130

Power Rail
120

Micro TSV
110

Source
Region
102

Co-
planarization

Physically
contacting
one another

Cross Section
View

Width 250

Thickness
252

Width 260

Thickness
262

Thickness
242

Silicon
Substrate
Layer
230

Oxide Layer 220

Oxide Layer 220

Silicon
Substrate
Layer
230

Width 270

Width 240

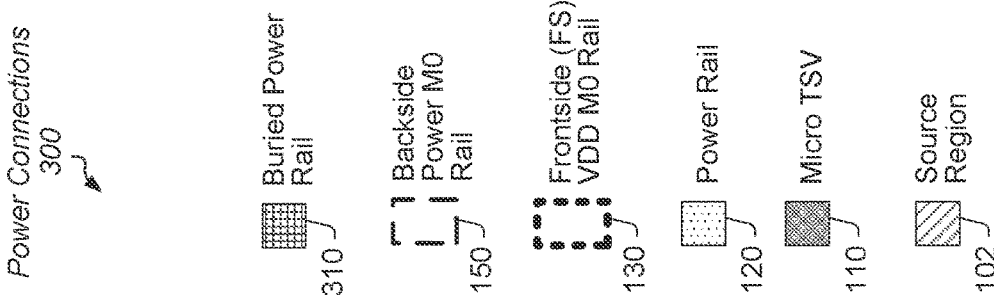
*Power Connections*
*300*
Buried Power Rail
310
Backside Power M0 Rail
150
Frontside (FS) VDD M0 Rail
130
Power Rail
120
Micro TSV
110
Source Region
102
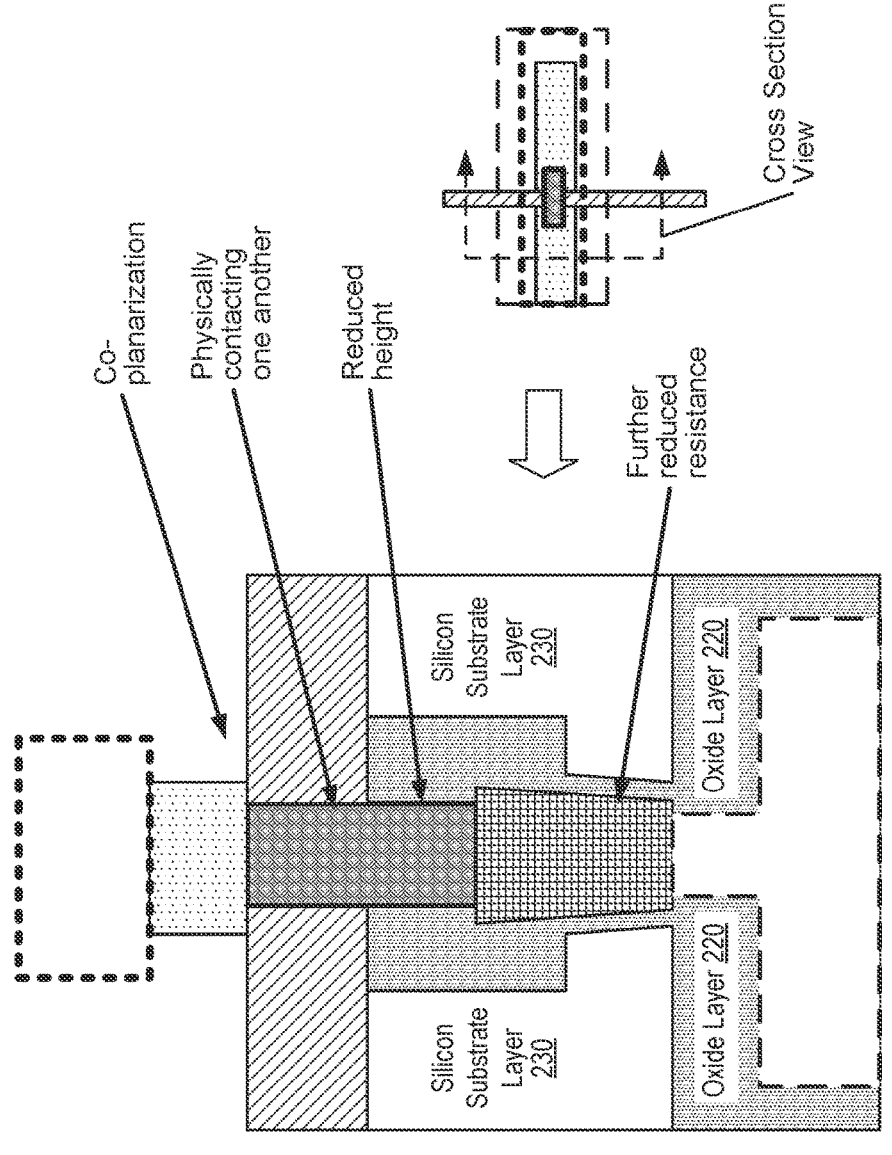
Co-planarization
Physically contacting one another
Reduced height
Further reduced resistance
Silicon Substrate Layer 230
Oxide Layer 220
Oxide Layer 220
Silicon Substrate Layer 230
Cross Section View
*FIG. 3*

*Method*
*400*

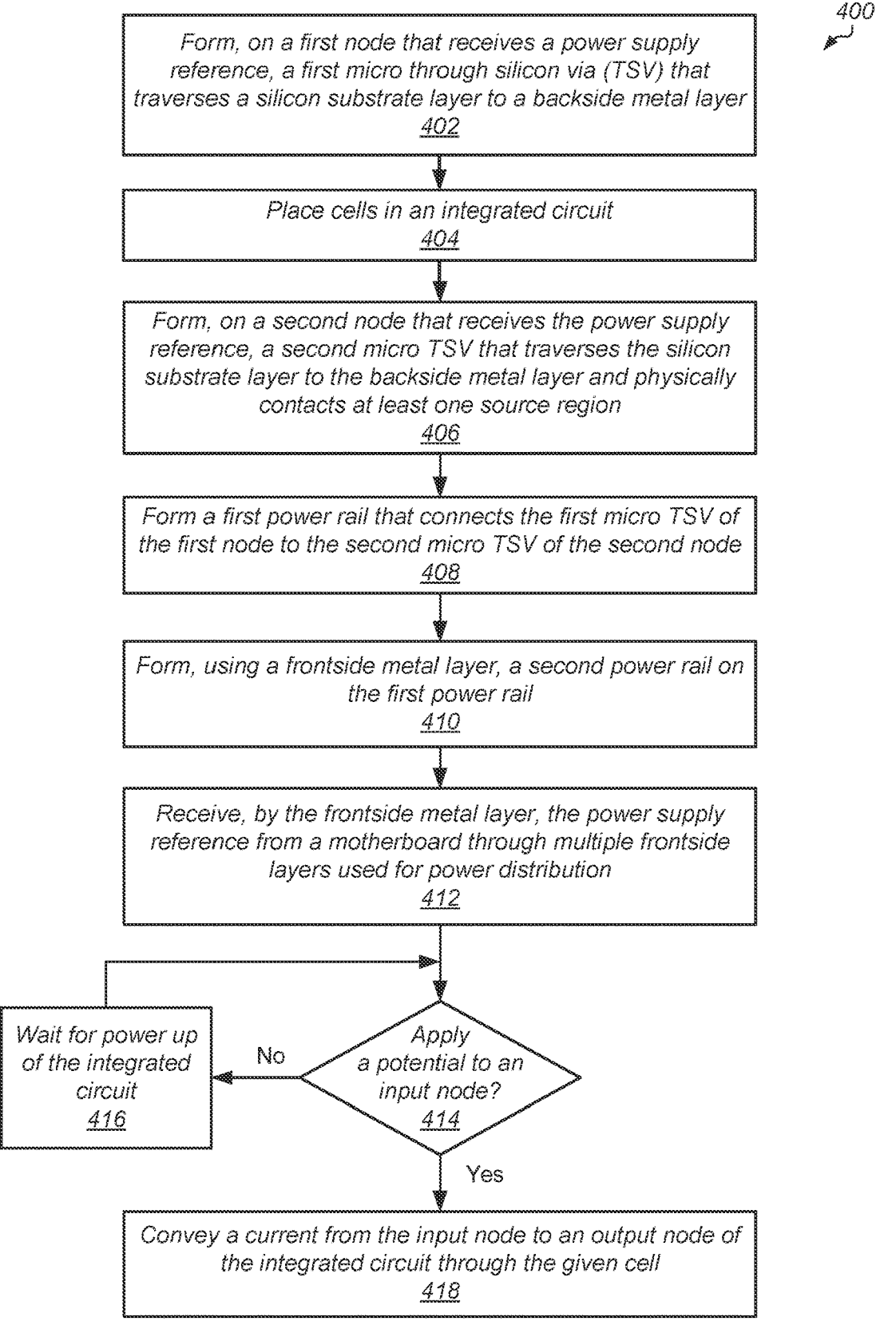

Form, on a first node that receives a power supply reference, a first micro through silicon via (TSV) that traverses a silicon substrate layer to a backside metal layer
*402*

Place cells in an integrated circuit
*404*

Form, on a second node that receives the power supply reference, a second micro TSV that traverses the silicon substrate layer to the backside metal layer and physically contacts at least one source region
*406*

Form a first power rail that connects the first micro TSV of the first node to the second micro TSV of the second node
*408*

Form, using a frontside metal layer, a second power rail on the first power rail
*410*

Receive, by the frontside metal layer, the power supply reference from a motherboard through multiple frontside layers used for power distribution
*412*

Wait for power up of the integrated circuit
*416*

No

Apply a potential to an input node?
*414*

Yes

Convey a current from the input node to an output node of the integrated circuit through the given cell
*418*

*FIG. 4*

*Computing System*
*500*

POWER VIA WITH REDUCED RESISTANCE

BACKGROUND

Description of the Relevant Art

As both semiconductor manufacturing processes advance and on-die geometric dimensions reduce, semiconductor chips provide more functionality and performance. While many advances have been made, design issues still arise with modern techniques in processing and integrated circuit design that limit potential benefits. For example, voltage droop of modern integrated circuits has become an increasing design issue with each generation of semiconductor chips. Voltage droop is a reduction in voltage value on a node that causes the voltage value to fall below a minimum threshold. For memories and latches without recovery circuitry, stored values can be lost. Voltage droop constraints are not only an issue for portable computers and mobile communication devices, but also for high-performance desktop computers and server computers that use superscalar microprocessors. There is dynamic voltage droop on the semiconductor chip that is caused by circuit capacitive and inductive elements. Circuit techniques, such as signal shielding and reducing the lengths of buses between repeaters, are used to reduce this type of voltage droop on the semiconductor chips.

Additionally, there is a resistive voltage droop, which is also referred to as the "IR droop," that is proportional to the multiplicative product of the current (I) flowing through a metal trace and the resistance (R) of this metal trace. Some of these metal traces are between the motherboard and a node of a transistor. Typically, the semiconductor chip includes multiple metal layers, such as 12 or more metal layers, between the motherboard and nodes of transistors. The voltage droop, such as the IR droop, increases as the number of metal layers increase. In addition, the standard cell layouts generally use at least one power rail for the supply voltage reference connections also referred to as the VDD power rail and one power rail for the ground reference connections also referred to as the VSS power rail.

In some cases, the power and ground rails use relatively long wires utilizing the metal layers of the multiple metal layers located closest to the transistors on the surface of the silicon substrate. These power rails have limited width due to the limited on-die area as the number of nodes and signals increase on the semiconductor chip to provide more functionality. The reduced width increases the resistance of the power rails, which increases voltage droop. Further, a limited number of vias are able to be formed on these power rails due to the limited on-die area as the number of nodes and signals increase. The limited number of vias leads to reduced semiconductor chip yield during manufacturing.

In view of the above, methods and systems for efficiently routing power signals across a semiconductor die are desired.

BRIEF DESCRIPTION OF THE DRAWINGS

FIG. 1 is a generalized diagram of a top view of a standard cell layout that utilizes techniques to reduce voltage droop and increase process yield.

FIG. 3 is a generalized diagram of a cross-section view of power connections that utilizes techniques to reduce voltage droop and increase process yield.

FIG. 4 is a generalized diagram of a method for efficiently creating integrated circuit layout for standard cells that utilizes techniques to reduce voltage droop and increase process yield.

Figure 2:
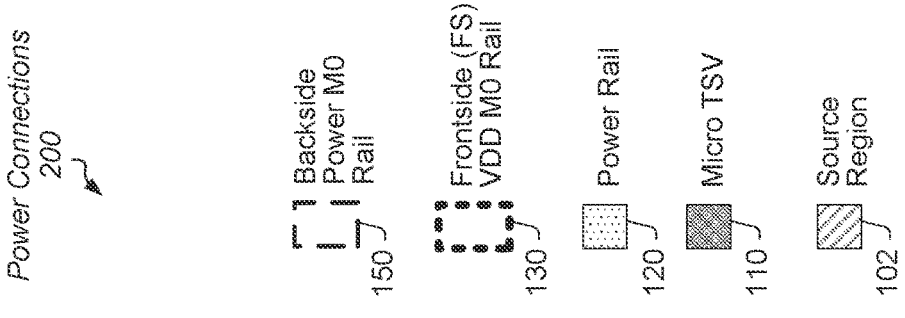
FIG. 2 is a generalized diagram of a cross-section view of power connections that utilizes techniques to reduce voltage droop and increase process yield.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Apparatuses and methods efficiently routing power signals across a semiconductor die are contemplated. In various implementations, an integrated circuit includes one or more standard cells, and the integrated circuit includes, at a first node that receives a power supply reference, a first micro through silicon via (TSV) that traverses through a silicon substrate layer to a backside metal layer. The integrated circuit includes, at a second node that receives the power supply reference, a second micro TSV that traverses through the silicon substrate layer to the backside metal layer and physically contacts at least one source region. The integrated circuit includes a first power rail that connects the first micro TSV of the first node to the second micro TSV of the second node. This power rail replaces contacts between a micro TSV and a frontside metal layer such as a metal zero (M0) layer. The M0 layer is a frontside metal layer of multiple frontside metal layers that is closest to the transistors on the surface of the silicon substrate.

The integrated circuit uses the M0 layer as a second power rail that is formed on top of the first power rail. This second power rail receives the power supply reference from a motherboard through multiple frontside layers used for power distribution. Each of the first power rail, the second power rail, and the backside metal layer provides power connection redundancy that increases charge sharing, improves wafer yield, and reduces voltage droop for the routing of the power supply reference voltage level (VDD). In some implementations, one or more of the first micro TSV and the second micro TSV has direct physical contact with a source region of a transistor. In an implementation, the first micro TSV and the second micro TSV are formed on top of a buried power rail located above the backside metal layer. The buried power rail provides further power connection redundancy. Further details of the integrated circuit are provided in the following description of FIGS. 1-5.

Referring to FIG. 1, a generalized block diagram is shown of a top view of a standard cell layout 100 that utilizes techniques to reduce voltage droop and increase process yield. In the illustrated implementation, the standard cell layout 100 is for any of a variety of types of Boolean gates and complex gates that include transistors arranged in a particular manner for providing data processing functionality or providing data storage. As used herein, a "transistor" is also referred to as a "semiconductor device" or a "device." The p-type metal oxide semiconductor (PMOS) field effect transistors FETS (or pfets) are located in the middle of the standard cell layout 100. For example, the p-type transistors (or devices) 160 and 162 are shown located in the middle of the standard cell layout 100. The n-type metal oxide semiconductor (NMOS) FETS (or nfets) are located at the top and the bottom of the standard cell layout 100. For example, the n-type transistors (or devices) 170 and 172 are shown located at the top and the bottom of the standard cell layout 100.

For ease of illustration, multiple layers are not shown, which are used to complete the circuitry the layout 100. For example, at least active regions and upper metal layers and corresponding contacts are not shown. Active regions for the p-type devices 160 and 162 include doped silicon for creating p-type transistors. For example, the silicon substrate in the active regions for the p-type devices 160 and 162 has been doped with Boron or Gallium during a semiconductor fabrication process. The active regions for the n-type devices 170 and 172 include doped silicon for creating n-type transistors. For example, the silicon substrate in the active regions for the n-type devices 170 and 172 has been doped with Phosphorous or Arsenic during the semiconductor fabrication process. Although the orientation of the standard cell layout 100 (or layout 100) is shown to have the p-type transistors at the middle and the n-type transistors at the top and bottom, other orientations are possible and contemplated. It is understood that a silicon wafer, an integrated circuit, and a semiconductor package using the silicon substrate layer can be rotated and flipped. Therefore, the materials and layers being described would be rotated and flipped, and the orientations and directions would have a different meaning. Therefore, the terms "top," "bottom," "horizontal," "vertical," "above," and "below" can change as the layout 100 is rotated or flipped, and the use of these terms in the below description correspond to the orientation being shown in the layout 100.

In some implementations, the devices (or transistors) in the standard cell layout 100 are planar devices. In other implementations, the devices (or transistors) in the standard cell layout 100 are non-planar devices. Non-planar transistors are used in semiconductor processing for reducing short channel effects. Tri-gate transistors, Fin field effect transistors (FETs), and gate all around (GAA) transistors are examples of non-planar transistors. As used herein, a "terminal" of a transistor is also referred to as a "region" of a transistor. For example, a source region is also referred to as a source terminal, a drain region is also referred to as a drain terminal, and a gate region is also referred to as a gate terminal. In the illustrated implementation, the standard cell layout 100 uses the source and drain regions 102 in the vertical direction. Examples of the source and drain regions 102 are trench silicide contacts. In some implementations, the source and drain regions 102 include Cobalt silicide (CoSi$_2$). In other implementations, the source and drain regions 102 include Titanium silicide (TiSi$_2$).

The layout 100 also uses the metal gate 104 in the vertical direction, and metal 0 (M0 or Metal0) for local interconnections in the horizontal direction. For example, the frontside power M0 rail or bus 130 is used to route a power signal such as a power supply reference voltage level (VDD) in the horizontal direction. The frontside power M0 rail or bus 140 is used to route a power signal such as a ground reference voltage level (VSS) in the horizontal direction. In some implementations, the metal gate 104 is formed from a variety of materials. Titanium nitride (TiN) is one example of material used to form the metal gates 104.

In some implementations, the devices in the standard cell layout 100 are fabricated by one of the immersion lithography techniques, the double patterning technique, the extreme ultraviolet lithography (EUV) technique, and the directed self-assembly (DSA) lithography technique. These techniques provide the resolution of each of the width and the pitch of the layout such as at least the horizontal frontside VDD M0 rail 130 and the horizontal frontside VSS M0 rail 140. When selecting between immersion lithography, double patterning, EUV and DSA techniques, and other techniques, cost is considered as the cost increases from immersion lithography to EUV. However, over time, the costs of these techniques adjust as well as additional and newer techniques are developed for providing relatively high resolution. Accordingly, one of a variety of lithography techniques is used to provide relatively high resolution for the width and the pitch.

In the layout 100, backside rails are used for routing power connections in addition to the frontside VDD M0 rail 130 and the frontside VSS M0 rail 140. The backside power M0 rails 150 are below the silicon substrate layer. Typically, the backside power M0 rail 150 is not shown from a top view of standard cell layout since the silicon substrate layer and other elements cover backside signal routes. However, the backside power M0 rail 150 is shown here to further illustrate the use of power connection redundancy that improves wafer yield and reduces voltage droop. For example, the backside power M0 rail 150 routed below the frontside VDD M0 rail 130 provides an additional conductive routing layer to transport current from a power supply to the p-type devices 160 and 162. In various implementations, one or more of the width and the thickness of the backside power M0 rail 150 is greater than the width and the thickness of the frontside VDD M0 rail 130. These greater dimensions of the backside power M0 rail 150 further increases charge sharing and further reduce the voltage droop.

To electrically connect the backside power M0 rail 150 and the frontside VDD M0 rail 130, the layout 100 includes the micro through silicon vias (TSVs) 110. Typically, the micro TSV 110 is not shown from a top view of standard cell layout since elements cover the micro TSVs 110. For example, the power rail 120 is routed over the micro TSVs 110. The frontside VDD M0 rail 130 is routed over the power rail 120. The "micro TSV" 110 is a through silicon via that traverses through the silicon substrate layer from the backside power M0 rail 150 to the power rail 120, and ends with physical contact at each of the backside power M0 rail 150 and the power rail 120. The distance between the backside power M0 rail 150 and the power rail 120 defines the height or length of the micro TSV 110, which traverses only the silicon substrate layer and any oxide layer above the backside power M0 rail 150. The micro TSV 110 does not physically extend into multiple insulation layers of a semiconductor die used for routing multiple frontside metal layers. Similarly, the micro TSV 110 does not physically extend into multiple insulation layers of the semiconductor die used for routing multiple backside metal layers. Although the power rail 120 is routed over the micro TSVs 110, the micro TSVs 110 are shown here to further illustrate the use of power connection redundancy that improves wafer yield and reduces voltage droop. In a similar manner, backside power M0 rails 150 are routed below the frontside VSS M0 rail 140, and micro TSVs 110 are used to electrically connect the backside power M0 rail 150 and the frontside VSS M0 rail 140.

For the p-type devices 160 and 162, rather than use a contact between a source terminal 102 and the frontside VDD M0 rail 130, the layout 100 includes the power rail 120. In the illustrated implementation, the power rail 120 runs below the frontside VDD M0 rail 130 and along the length of the frontside VDD M0 rail 130. The power rail 120 physically abuts the source terminals 102 of the p-type devices 160 and 162 that are routed to the frontside VDD M0 rail 130. The power rail 120 is physically adjacent to and between the frontside VDD M0 rail 130 and each of the source terminals 102 and the silicon substrate. In addition, the power rail 120 physically abuts the micro TSVs 110. In some implementations, the power rail 120 includes tungsten.

The power rail 120 reduces the resistance of the frontside VDD M0 rail 130 by providing an additional conductive routing layer to transport current from a power supply to the p-type devices 160 and 162. Routing a power supply voltage reference through each of the frontside VDD M0 rail 130, the power rail 120, and the backside power M0 rail 150 provides redundancy for the power connection. This redundancy improves wafer yield and reduces the voltage droop. If the voltage droop is reduced to a value below a threshold value, then performance increases and data corruption is avoided. Further, without adding extra routing in frontside metal layers, the use of the power rail 120, the micro TSVs 110 and the backside power M0 rail 150 scales along with standard cells as the on-die geometric dimensions reduce and the number of nodes and signals increase.

Referring now to FIG. 2, a generalized block diagram is shown of a cross-section view of power connections 200 that utilizes techniques to reduce voltage droop and increase process yield. Contacts (or vias), materials, structures and other layout elements described earlier are numbered identically. A top view of standard cell layout is provided on the right side of FIG. 2. This top view is a portion of the layout 100 shown earlier in FIG. 1. A cross-section view of this layout is shown on the left side of FIG. 2. The backside power M0 rail 150 is located below the silicon substrate layer 230 and the oxide layer 220, which is used for isolation. In the illustrated implementation, the backside power M0 rail 150 routes a power supply reference voltage level that is also routed by the power rail 120 and the frontside VDD M0 rail 130. It is noted that the below description is for routing the power supply reference voltage level (VDD) to one or two source regions 102 of p-type devices. However, the materials, components and connections can be used to also route the ground reference voltage level (VSS) to one or two source regions 102 of n-type devices.

The backside power M0 rail 150 is electrically connected to the power rail 120 and the frontside VDD M0 rail 130 through the micro TSV 110. As described earlier, the micro TSV 110 is a through silicon via that traverses through the silicon substrate layer 230 from the backside power M0 rail 150 to the power rail 120, and ends with physical contact at each of the backside power M0 rail 150 and the power rail 120. Therefore, the distance between the backside power M0 rail 150 and the power rail 120 that defines the height or length of the micro TSV 110 traverses only the silicon substrate layer 230 and the oxide layer 220 above the backside power M0 rail 150. In contrast, other types of TSVs traverse through a silicon substrate and additionally traverse through multiple insulation layers of a semiconductor die used for routing multiple frontside metal layers. Some TSVs traverse through an entire semiconductor die such as from a micro bump on an interposer or a semiconductor substrate core and entirely through the first semiconductor die to multiple insulation layers of a second semiconductor die stacked vertically adjacent to the first semiconductor die. Other TSVs traverse through the first semiconductor die and entirely through an interposer or a semiconductor substrate core to interconnects such as controlled collapse of chip connection (C4) bumps. These types of TSVs are also referred to as "through-bulk silicon vias." The height or length of the micro TSV 110 is smaller than the heights or lengths of the other types of TSVs, which are capable of additionally traversing other layers besides the silicon substrate layer 230 and the oxide layer 220 above the backside power M0 rail 150.

In various implementations, the frontside VDD M0 rail 130 is a frontside metal layer of multiple frontside metal layers that is closest to the transistors on the surface of the silicon substrate layer 230. Each of the power rail 120, the frontside VDD M0 rail 130, and the backside power M0 rail 150 is routed into and out of the page. The use of the power rail 120, the frontside VDD M0 rail 130, and the backside power M0 rail 150 provides power connection redundancy that increases charge sharing, improves wafer yield, and reduces voltage droop for the routing of the power supply reference voltage level (VDD).

As shown, the dimensions of the backside power M0 rail 150 include a width 240 and a thickness 242, the dimensions of the power rail 120 include a width 260 and a thickness 262, and the of the frontside VDD M0 rail 130 include a width 250 and a thickness 252. In some implementations, one or more of the width 240 and the thickness 242 of the backside power M0 rail 150 is greater than a respective one of the width 250 and the thickness 252 of the frontside VDD M0 rail 130. Therefore, the backside power M0 rail 150 provides a less resistive path than the frontside VDD M0 rail 130 to transport current from a power supply to p-type devices that include the two source regions 102 abutted with the micro TSV 110.

As described earlier, each of the power rail 120 and the frontside VDD M0 rail 130 is routed into and out of the page. In some implementations, the power rail 120 is routed underneath and along the frontside VDD M0 rail 130 from the micro TSV 110 to one other micro TSV. Therefore, a length of the power rail 120 is at least a length of a distance on the surface of the silicon substrate layer 230 between the two micro TSVs. In another implementation, the power rail 120 is routed underneath and along the frontside VDD M0 rail 130 from the micro TSV 110 to two or more other micro TSVs. In yet other implementations, a length of the power rail 120 is equal to a length of the frontside VDD M0 rail 130. In some implementations, the width 260 of the power rail 120 is greater than the width 270 of the micro TSV 110. In other implementations, the width 260 of the power rail 120 is less than or equal to the width 270 of the micro TSV 110. In either case, the power rail 120 with the dimensions of the width 260, the thickness 262, and the length that is equal to at least a distance between two micro TSVs reduces the voltage droop for the routing of the power supply reference voltage level (VDD).

In various implementations, the source terminals 102 have physical contact with the micro TSV 110. Therefore, the power supply reference voltage level (VDD) is routed to one or more source regions 102 of p-type devices. In various implementations, during semiconduction fabrication, the micro TSV 110 and the source regions 102 are co-planarized. A chemical mechanical planarization (CMP) step is used to remove unwanted material such as tungsten of the micro TSV 110 and Cobalt silicide of the source regions 102 after both materials are placed. For example, the micro TSV is formed after patterning with lithography, the silicon substrate layer is etched, and one of Cobalt (Co), Ruthenium (Ru), or other material is deposited. Following, the Cobalt silicide (Co Si 2) is patterned and formed (etched and filled) to form the source regions 102. The source regions 102 have a sidewall connection with the micro TSV 110. Next, the CMP steps planarizes together the source regions 102 and the micro TSV 110. The CMP step also polishes the remaining materials of the micro TSV 110 and the source regions 102. The CMP step achieves a near-perfect flat and smooth surface upon which further layers of integrated circuitry are built.

Turning now to FIG. 3, a generalized block diagram of a cross-section view of power connections 300 is shown that utilizes techniques to reduce voltage droop and increase process yield. Contacts (or vias), materials, structures and other layout elements described earlier are numbered identically. A top view of standard cell layout is provided on the right side of FIG. 3. This top view is a portion of the layout 100 shown earlier in FIG. 1. A cross-section view of this layout is shown on the left side of FIG. 3. It is noted that the below description is for routing the power supply reference voltage level (VDD) to one or two source regions 102 of p-type devices. However, similar to the power connections 200 (of FIG. 2), the materials, components and connections can be used to also route the ground reference voltage level (VSS) to one or two source regions 102 of n-type devices.

A buried power rail (BPR) 310 is included below the micro TSV 110. In some implementations, the BPR 310 includes Ruthenium (Ru). Similar to the power rail 120, the frontside VDD M0 rail 130, and the backside power M0 rail 150, the BPR 310 is routed into and out of the page. The BPR 310 further reduces the resistance of the frontside VDD M0 rail 130 by providing an additional conductive routing layer to transport current from a power supply to one or two source regions 102 of p-type devices. The use of the power rail 120, the frontside VDD M0 rail 130, the BPR 310, and the backside power M0 rail 150 provides power connection redundancy that increases charge sharing, improves wafer yield, and reduces voltage droop for the routing of the power supply reference voltage level (VDD).

Including the BPR 310 also reduces the height of the micro TSV 110, which reduces the resistance of the micro TSV 110. Therefore, the inclusion of the BPR 310 further increases charge sharing and reduces the voltage droop for the routing of the power supply reference voltage level (VDD). If the voltage droop is reduced to a value below a threshold value, then performance increases and data corruption is avoided. Further, without adding extra routing in frontside metal layers, the use of the power rail 120, the micro TSV 110, the BPR 310, and the backside power M0 rail 150 scales along with standard cells as the on-die geometric dimensions reduce and the number of nodes and signals increase.

Referring now to FIG. 4, a generalized block diagram is shown of a method 400 for efficiently creating integrated circuit layout for standard cells that utilizes techniques to reduce voltage droop and increase process yield. For purposes of discussion, the steps in this implementation are shown in sequential order. However, in other implementations some steps occur in a different order than shown, some steps are performed concurrently, some steps are combined with other steps, and some steps are absent.

A semiconductor fabrication process forms, on a first node that receives a power supply reference, a first micro through silicon via (TSV) that traverses through a silicon substrate layer to a backside metal layer (block 402). The semiconductor fabrication process (or process) places cells, such as standard cells, in an integrated circuit (block 404). The process forms, on a second node that receives the power supply reference, a second micro TSV that traverses through the silicon substrate layer to the backside metal layer and physically contacts at least one source region (block 406). The process forms a first power rail that connects the first micro TSV of the first node to the second micro TSV of the second node (block 408).

The process forms, using a frontside metal layer, a second power rail on the first power rail (block 410). The process receives, by the frontside metal layer, the power supply reference from a motherboard through multiple frontside layers used for power distribution (block 412). If a potential is not applied to an input node of the integrated circuit ("no" branch of the conditional block 414), then the integrated circuit waits for power up (block 416). However, if a potential is applied to the input node of the integrated circuit ("yes" branch of the conditional block 414), then the integrated circuit conveys a current from the input node to an output node through the given cell (block 418).

Figure 5:
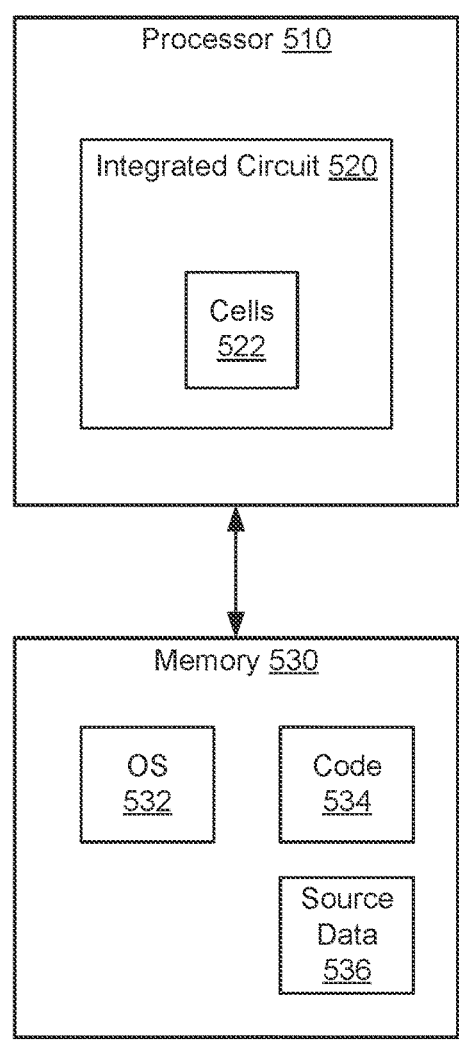
FIG. 5 is a generalized diagram of a computing system 500 with standard cells that utilizes techniques to reduce voltage droop and increase process yield.

Referring to FIG. 5, a generalized block diagram is shown of a computing system 500 with standard cells that utilizes techniques to reduce voltage droop and increase process yield. The computing system 500 includes the processor 510 and the memory 530. Interfaces, such as a memory controller, a bus, or a communication fabric, one or more phased locked loops (PLLs) and other clock generation circuitry, a power management unit, and so forth, are not shown for ease of illustration. It is understood that in other implementations, the computing system 500 includes one or more of other processors of a same type or a different type than processor 510, one or more peripheral devices, a network interface, one or more other memory devices, and so forth. In some implementations, the functionality of the computing system 500 is incorporated on a system on chip (SoC). In other implementations, the functionality of the computing system 500 is incorporated on a peripheral card inserted in a motherboard. The computing system 500 is used in any of a variety of computing devices such as a desktop computer, a tablet computer, a laptop, a smartphone, a smartwatch, a gaming console, a personal assistant device, and so forth.

The processor 510 includes hardware such as circuitry. For example, the processor 510 includes at least one integrated circuit 520. The integrated circuit 520 includes cells 522 where one or more of these cells 522 uses power connection redundancy that increases charge sharing, improves wafer yield, and reduces voltage droop. In various implementations, one or more of the cells 522 uses power connection techniques used in the standard cell layout 100 (of FIG. 1), the power connections 200 (of FIG. 2), and the power connections 300 (of FIG. 3). In some implementations, the processor 510 includes one or more processing units. In some implementations, each of the processing units includes one or more processor cores capable of general-purpose data processing, and an associated cache memory subsystem. In such an implementation, the processor 510 is a central processing unit (CPU). In another implementation, the processing cores are compute units, each with a highly parallel data microarchitecture with multiple parallel execution lanes and an associated data storage buffer. In such an implementation, the processor 510 is a graphics processing unit (GPU), a digital signal processor (DSP), or other.

In some implementations, the memory 530 includes one or more of a hard disk drive, a solid-state disk, other types of flash memory, a portable solid-state drive, a tape drive and so on. The memory 530 stores an operating system (OS) 532, one or more applications represented by code 534, and at least source data 536. Memory 530 is also capable of storing intermediate result data and final result data generated by the processor 510 when executing a particular application of code 534. Although a single operating system 532 and a single instance of code 534 and source data 536 are shown, in other implementations, another number of these software components are stored in memory 530. The operating system 532 includes instructions for initiating the boot up of the processor 510, assigning tasks to hardware circuitry, managing resources of the computing system 500 and hosting one or more virtual environments.

Each of the processor 510 and the memory 530 includes an interface unit for communicating with one another as well as any other hardware components included in the computing system 500. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g., synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g., Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases, the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
   a first micro through silicon via (TSV) at a first location on a surface of a silicon substrate layer, wherein the first micro TSV traverses through the silicon substrate layer to physically connect to a backside metal layer;
   a second micro TSV at a second location different from the first location on the surface of the silicon substrate layer; and
   a first power rail physically abutting each of the first micro TSV and the second micro TSV; and
   wherein responsive to a potential being applied to an input node of a cell of the integrated circuit, a current is conveyed from the input node to an output node of the cell through at least the first power rail.

2. The integrated circuit as recited in claim 1, further comprising a second power rail that comprises a metal layer of a plurality of frontside metal layers located closest to transistors of the integrated circuit, wherein the first power rail is physically adjacent to and between the second power rail and each of the first micro TSV and the second micro TSV.

3. The integrated circuit as recited in claim 2, wherein one or more of the first micro TSV and the second micro TSV is adjacent to a buried power rail that is adjacent to the backside metal layer.

4. The integrated circuit as recited in claim 2, wherein one or more of the first micro TSV and the second micro TSV is physically adjacent to a source region of a transistor.

5. The integrated circuit as recited in claim 2, wherein a width of the first power rail is greater than a width of the first micro TSV.

6. The integrated circuit as recited in claim 2, wherein a length of the first power rail is at least a length of a distance between the first location and the second location on the surface of the silicon substrate layer.

7. The integrated circuit as recited in claim 6, wherein the length of the first power rail is equal to a length of the second power rail.

8. A method comprising:
   forming a first micro through silicon via (TSV) at a first location on a surface of a silicon substrate layer, wherein the first micro TSV traverses through the silicon substrate layer to physically connect to a backside metal layer;

forming a second micro TSV at a second location different from the first location on the surface of the silicon substrate layer; and forming a first power rail physically abutting each of the first micro TSV and the second micro TSV.

9. The method as recited in claim 8, further comprising forming a second power rail that comprises a metal layer of a plurality of frontside metal layers located closest to transistors of an integrated circuit, wherein the first power rail is physically adjacent to and between the second power rail and each of the first micro TSV and the second micro TSV.

10. The method as recited in claim 9, further comprising forming one or more of the first micro TSV and the second micro TSV adjacent to a buried power rail that is adjacent to the backside metal layer.

11. The method as recited in claim 9, further comprising forming one or more of the first micro TSV and the second micro TSV physically adjacent to a source region of a transistor.

12. The method as recited in claim 9, further comprising forming the first power rail with a width that is greater than a width of the first micro TSV.

13. The method as recited in claim 9, further comprising forming the first power rail with a length that is at least a length of a distance between the first location and the second location on the surface of the silicon substrate layer.

14. The method as recited in claim 13, further comprising forming the first power rail with the length that is equal to a length of the second power rail.

15. A computing system comprising:

a memory configured to store instructions of one or more tasks and source data to be processed by the one or more tasks;

an integrated circuit configured to execute the instructions using the source data, wherein the integrated circuit comprises:

a first micro through silicon via (TSV) at a first location on a surface of a silicon substrate layer, wherein the first micro TSV traverses through the silicon substrate layer to physically connect to a backside metal layer;

a second micro TSV at a second location different from the first location on the surface of the silicon substrate layer; and a first power rail physically abutting each of the first micro TSV and the second micro TSV; and wherein responsive to a potential being applied to an input node of a cell of the integrated circuit, a current is conveyed from the input node to an output node of the cell through at least the first power rail.

16. The computing system as recited in claim 15, wherein the integrated circuit further comprises a second power rail that comprises a metal layer of a plurality of frontside metal layers located closest to transistors of the integrated circuit, wherein the first power rail is physically adjacent to and between the second power rail and each of the first micro TSV and the second micro TSV.

17. The computing system as recited in claim 16, wherein one or more of the first micro TSV and the second micro TSV is adjacent to a buried power rail that is adjacent to the backside metal layer.

18. The computing system as recited in claim 16, wherein one or more of the first micro TSV and the second micro TSV is physically adjacent to a source region of a transistor.

19. The computing system as recited in claim 16, wherein a width of the first power rail is greater than a width of the first micro TSV.

20. The computing system as recited in claim 16, wherein a length of the first power rail is at least a length of a distance between the first location and the second location on the surface of the silicon substrate layer.

* * * * *